United States Patent
Ishikawa

(10) Patent No.: US 7,493,579 B2
(45) Date of Patent: Feb. 17, 2009

(54) METHOD FOR THE GENERATION OF STATIC NOISE CHECK DATA IN THE LAYOUT HIERARCHICAL DESIGN OF AN LSI

(75) Inventor: Yoichiro Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 544 days.

(21) Appl. No.: 11/091,498

(22) Filed: Mar. 29, 2005

(65) Prior Publication Data

US 2006/0136851 A1   Jun. 22, 2006

(30) Foreign Application Priority Data

Dec. 21, 2004   (JP) .............................. 2004-368705

(51) Int. Cl.
    *G06F 17/50* (2006.01)
(52) U.S. Cl. ......................................................... 716/6
(58) Field of Classification Search ...................... 716/1, 716/4–6, 16
    See application file for complete search history.

(56) References Cited

U.S. PATENT DOCUMENTS 5,519,630 A * 5/1996 Nishiyama et al. ............ 716/17
7,325,212 B2 * 1/2008 Ishikawa ........................ 716/6

FOREIGN PATENT DOCUMENTS

JP   05-216950   8/1993
JP   11-218900   8/1999

OTHER PUBLICATIONS

"Analysis of Static Crosstalk Delay and IR Drop Delay," Nihon Synopsis Co., Ltd., Sep. 2002.

\* cited by examiner

*Primary Examiner*—Stacy A Whitmore
(74) *Attorney, Agent, or Firm*—Westerman, Hattori, Daniels & Adrian, LLP.

(57) ABSTRACT

In the static noise check of the LSI hierarchical design, in order to reduce the data volume of the common parts and load of the design operation and design automation, when a plurality of cores, comprising same sub-chips, are present, the static noise check data for the whole chip is generated from the core-level design data of one of the cores, and the chip-level design data.

1 Claim, 13 Drawing Sheets

CORE A, CORE B, CORE C AND CORE D ARE CORES COMPRISING THE SAME SUB-CHIPS, AND ALSO HAVING THEIR INDIVIDUAL DATABASE FOR THE LSI

⇩

BECAUSE ALL HAVE THE COMMON PARTS, DATA VOLUME BECOMES LARGE, AND DESIGN OPERATION AND DA HAVE GREAT LOAD.

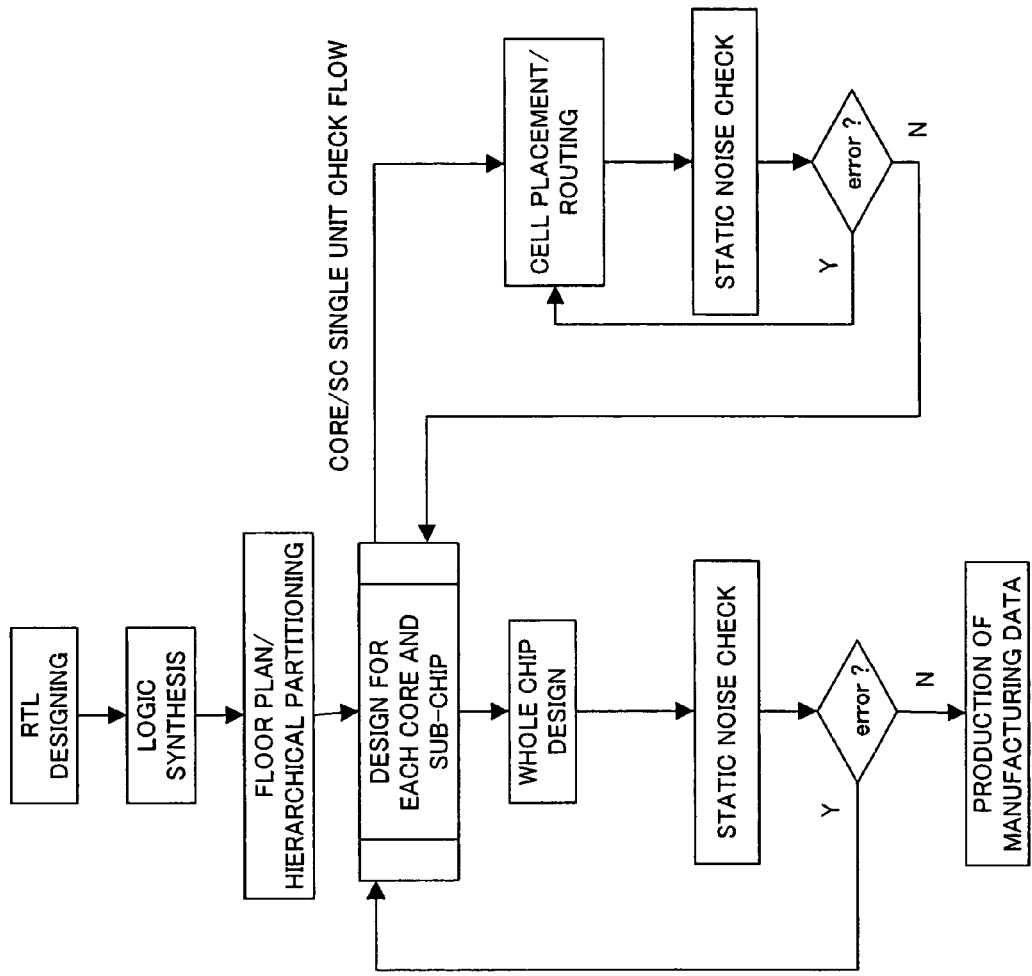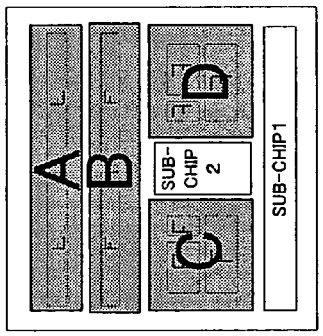
FIG. 3 PRIOR ART

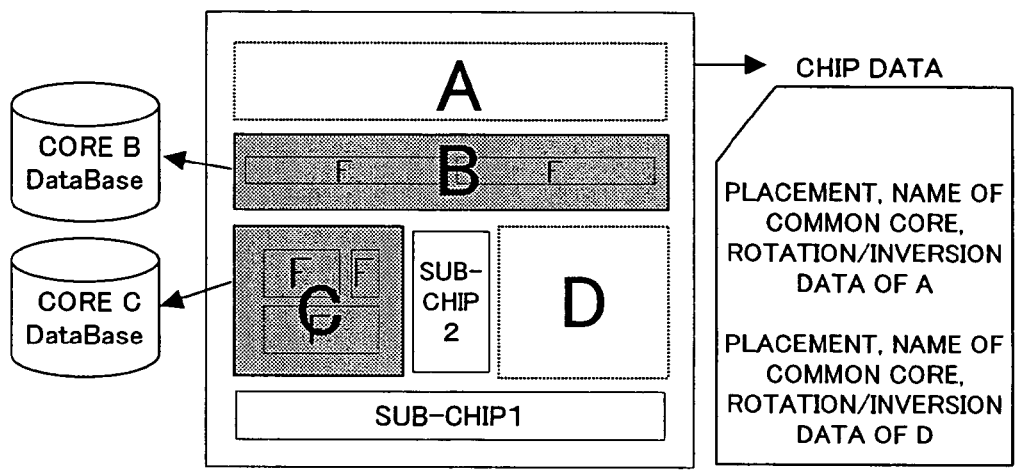

A AND D DO NOT HAVE DATABASE
BUT HAVE CHIP DATA INCLUDING
PLACEMENT, ROTATION/INVERSION
DATA, AND NAME OF BASE CORE
WHEN IN STATIC NOISE CHECK OF
THE CORE A AND THE CORE D, THE
WIRING INFORMATION OF THE CORE
A AND THE CORE D IS ESTABLISHED
WITH REFERENCE TO THE CHIP
DATE OF THE CORE A AND THE
CORE D AND TO THE WIRING
INFORMATION IN THE DATABASES
OF THE CORE B AND THE CORE C.

DATA VOLUME IN THE COMMON
PARTS ARE REDUCED AND LOAD
OF DESIGN OPERATION AND DA
IS ALSO REDUCED

F I G. 6

METHOD FOR THE GENERATION OF STATIC NOISE CHECK DATA IN THE LAYOUT HIERARCHICAL DESIGN OF AN LSI

BACKGROUND OF THE INVENTION

1. Field of the Invention

The present invention relates to a method for the generation of static noise check data in the layout hierarchical design of an LSI.

2. Description of the Related Art

The recent advancement of high integration in LSI has made the configuration of a large-scale circuit on an LSI a real possibility. Such LSI design adopts an approach of hierarchical designing in which a circuit is partitioned into sub-circuits and is sequentially designed in a hierarchical fashion. FIG. 1 explains the 4-tier hierarchical configuration of the LSI design. In FIG. 1, it is described that the LSI design comprises the four hierarchies; chip-level hierarchy, core-level hierarchy, sub-chip SC hierarchy (i.e. divided physical blocks), and layout sub-group LSG hierarchy, and employs RAM macros and standard cells.

As shown in FIG. 2, among a plurality of sub-chips on an LSI, some have the same kind of module (logical block). In the conventional LSI layout hierarchical structure, these sub-chips with the same module have the design data with instance names so that the individual sub-chip is unique on the LSI.

Core A and core B in FIG. 2 are cores comprising the same sub-chips and core C and core D in FIG. 2 are cores also comprising the same sub-chips and these four cores have their individual database for the LSI. Because all have common parts, data volume becomes large, and design operation and design automation (DA) has great load.

FIG. 3 indicates the overall flow of an example of the conventional LSI design for the reference purpose.

Each core and sub-chip is designed after designing in the register transfer level, logic synthesis, floor planning, and hierarchical partitioning. Designing of each core and sub-chip involves the designing of the cell placement and routing, and static noise check in each core and sub-chip is performed based on the designed cell placement and routing. Designing of the cell placement and routing is repeated until the error is eliminated.

After designing of each core and sub-chip, the whole chip is designed and static noise check is performed. When the error occurs in the static noise check, the process goes back to the designing of each core and sub-chip, redesigning the whole chip and producing manufacturing data by repeating the static noise check until errors are eliminated.

FIG. 4 is a model of net path, which performs static noise check.

The victim net is a net whose noise value is calculated, and the aggressor net is a net generating noise in the victim net.

The noise value in a part between the wirings of the victim net and the aggressor net, influenced by noise, is accumulated, and by comparing the accumulated noise value with the limit value, the check whether the error has occurred is performed.

FIG. 5 explains the flow of static noise check.

As shown in FIG. 5, each wiring to be object for static noise check is considered as a victim net, it goes through processing for each victim net, and the error list is output.

In the following description, an example of processing for each victim net is explained with reference to FIG. 5.

In the step S100, first, a wiring propagating a signal which could give a noise influence to the victim net is selected as the aggressor net (filtering of the aggressor net).

In the step S200, next, 1:1 noise value of the victim net and each aggressor net is calculated, and is checked with the limit value.

In the following description, calculation of 1:1 noise value $Nv11$, limit value $LX1$ and the formula for the checking is provided.

$$Nv11 = \Sigma\{Ln \times Ka \times f(C,L)\} \leq LX1$$

$Ln$ is a length of a specific net part of the aggressor net running parallel to the adjacent area of the victim net. $Ka$ is a check coefficient of the victim net and aggressor net. $f(C,L)$ is a relaxation function, and is obtained from the distance and the capacitance. Cumulative calculation of the product and the sum with wiring length $Ln$, which is a specific net part of the aggressor net running parallel to the adjacent area of the victim net, is operated. The $LX1$, the limit value of the 1:1 noise, is determined by the combination of the victim net and the aggressor net.

Errors are determined in the step S300. When the check result shows errors, the error net data is stored in the step S400, and when the check result does not show any error, the process goes to the Step S500 to calculate 1:2 noise value of the victim net and each aggressor net and to check with the limit value.

In the following description, the calculation of 1:2 noise value $Nv12$, limit value $LX2$ and the formula for the checking is provided.

$$Nv12 = (Nv11a + Nv11b) \times Kb \leq LX2$$

The 1:2 noise value $Nv12$ expresses the noise given to the victim net by the aggressor net 1 and the aggressor net 2. $Nv11a$ is the 1:1 noise value given to the victim net by the aggressor net 1, and $Nv11b$ is also the 1:1 noise value given to the victim net by the aggressor net 2. $Kb$ is a check coefficient of the victim net and the aggressor net. $LX2$, which is a limit value of the 1:2 noise, is determined by the combination of the victim net and the aggressor nets.

Errors are determined in the step S600. When the check result does not show errors, the process is completed, and when the check result shows any error, the process goes to the step S700 to check the timing at the timing window, then the process goes to the step S800 where errors are determined, and when the check result does not show any errors, the process is terminated, and when the check result shows an error, the process goes to the step S900 to store the error net data.

As explained above, it is required to operate the calculation for the combination of the each wiring for static noise check.

In recent years, the design of the core, for example, has the configuration with the 2~4 same cores such as 2 cores and 4 cores, in one LSI. In such a case, those cores have individual data though design content (module) is the same, and it creates the large unnecessary data volume and great load to the design operation and DA. In the static noise check, which includes more calculation volume among the design operations, the load of the static noise check is significant.

The static noise in the LSI relating to the present invention is described in the following Non-Patent Document.

<Non-Patent Document>
"Static Cross Talk and IR Drop Delay Analysis," Nihon Synopsys Co., Ltd, (September 2002),
(http://www.synopsys.co.jp/marketing_pdf/staticxtalkir-drop.pdf)

SUMMARY OF THE INVENTION

It is the object of the present invention to reduce the data volume of the common parts and the load of the design operation and DA in the static noise check of the LSI hierarchical design.

In order to achieve the above object, only core-level design data of one core among a plurality of cores, consisting of identical sub-chips, is stored, and the static noise check data for the whole chip is produced from the core-level design data of the one core and the chip-level design data. Therefore, the data volume of the common part can be reduced, and the load of the design operation and DA is also reduced.

BRIEF DESCRIPTION OF THE DRAWINGS

FIG. 3 indicates the overall flow of an example of a conventional LSI design;

FIG. 6 explains the principle of the present invention;

DESCRIPTION OF THE PREFERRED EMBODIMENT

FIG. 6 explains the principle of the present invention.

Here, one chip comprises a core A, a core B, a core C, a core D, a sub-chip 1 and a sub-chip 2, and the core A and the core B have the same module and the core C and the core D have the same module. In such a case, the core B and the core C have databases for design data such as wiring data, however the core A and the core D do not have such database but have chip data comprising placement, rotation/inversion conditions and the name of the base core. When in static noise check of the core A and the core D, the wiring information of the core A and the core D is established with reference to the chip data of the core A and the core D and to the wiring information in the databases of the core B and the core C.

Figure 7:
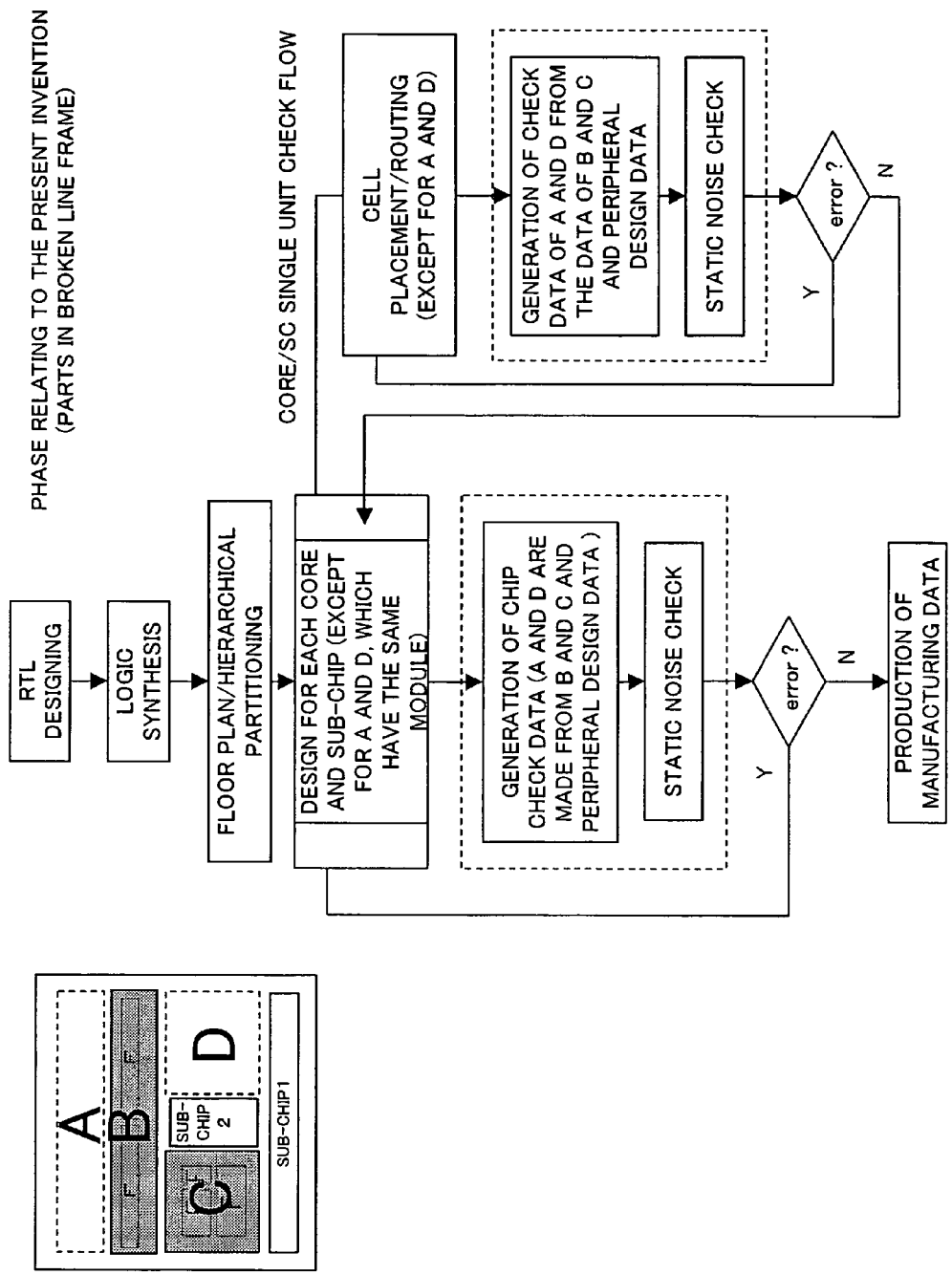
FIG. 7 explains the overall flow of the LSI design adopting the illustrated embodiment of the present invention.

FIG. 7 explains the overall flow of the LSI design adopting the illustrated embodiment of the present invention, and it is the same as the overall flow of a conventional LSI design in FIG. 3 with some parts being changed. In a similar way to the conventional design, after a register transfer level (RTL) design, logic synthesis, floor planning and hierarchical partitioning, design for each core and sub-chip is carried out. However, in the illustrated embodiment of the present invention, cell placement/routing design of the core A and the core C, which comprise the same module, is not carried out. As to the static noise check of the core A and the core C, the check data is made from cell placement/wiring data and peripheral design data of the core B and the core C.

After finishing the designing in each core and sub-chip, data for a chip static noise check is made as the whole chip design. Here, the data for the static noise check of the core A and the core C is made from the cell placement/wiring data and the peripheral design data of the core B and the core C.

Figure 8:
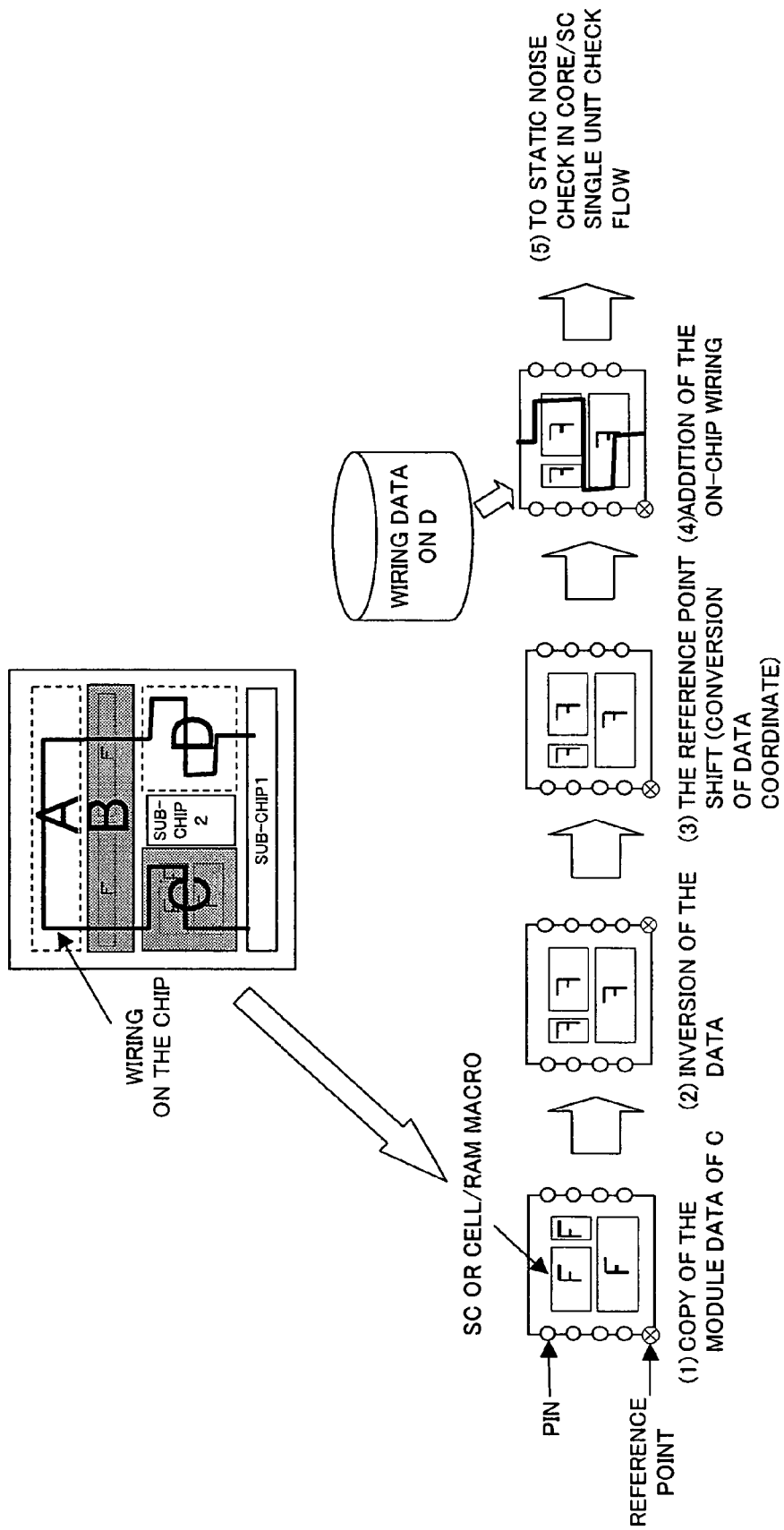
FIG. 8 is a diagram explaining the generation of check data for the same cores.

FIG. 8 is a diagram explaining the generation of check data for cores comprising the same module, and more specifically, explaining the method of generation of data of the core D from the data of the core C.

First, the module data of the core C is copied in the step (1). The data is inverted in the step (2), and the reference point is shifted (i.e. data coordination conversion) in the step (3). Wiring on the chip is added based on the chip wiring data on core D in the step (4), and finally, the data is provided to the static noise check of the core/sub-chip single unit check flow shown in FIG. 7 in the step (5). The same process is carried out when the data of the core A is made from the data of the core B.

Figure 9:
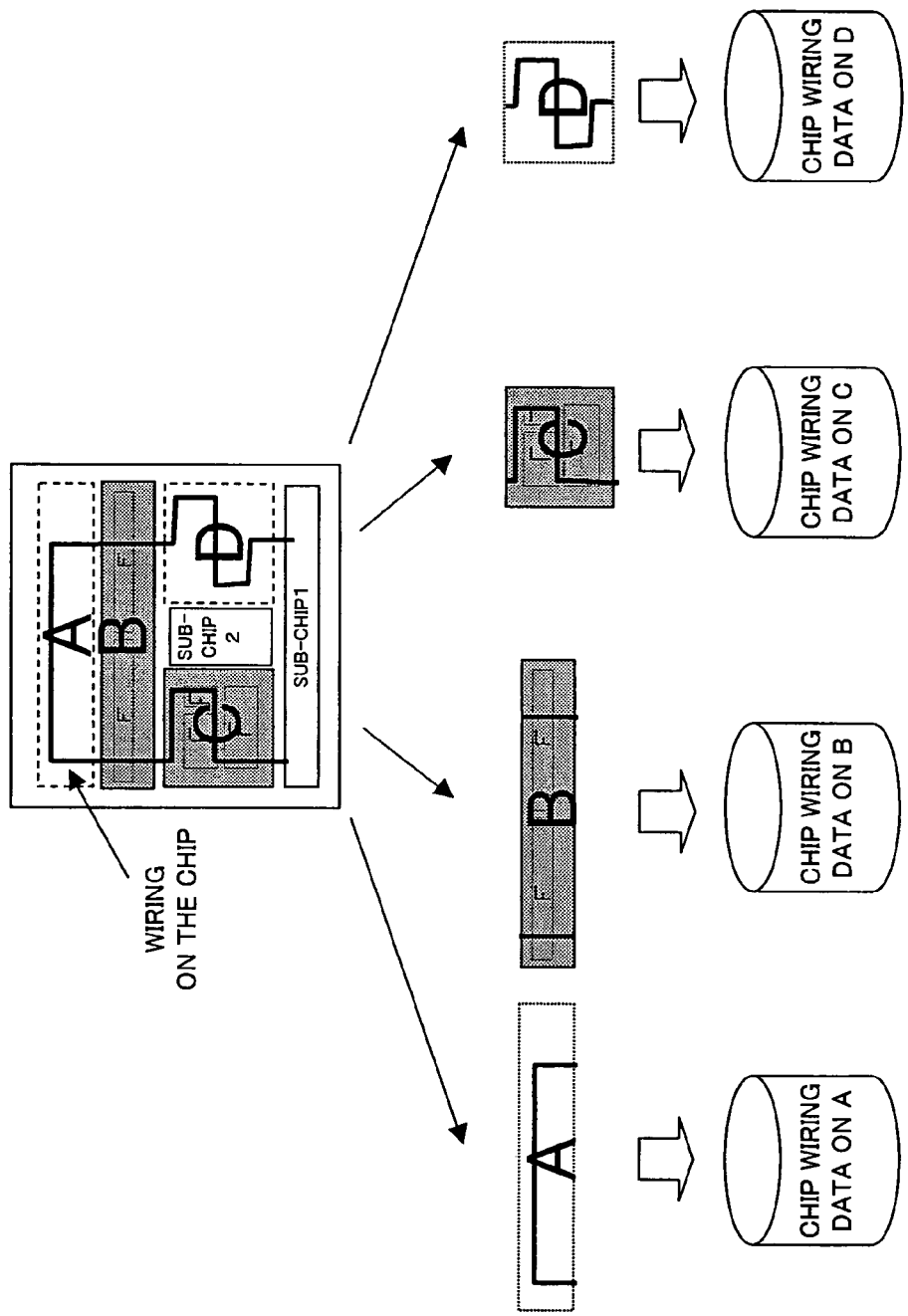
FIG. 9 is an explanatory diagram of the method for clipping the wiring data on the chip at the outer frame of a core or a sub-chip, and for storing the data.

FIG. 9 is an explanatory diagram of the method for clipping the wiring data on the chip at the outer frame of a core or a sub-chip, and for storing the clipped data as chip wiring data on the core. The chip wiring data on core B and the chip wiring data on core C are clipped from the wiring data on the chip, and in addition, the chip wiring data on core A and the chip wiring data on core D is clipped from the wiring data on the chip with reference to the data of the core B and C and the information of the core A and D on the chip. The wiring data on the chip clipped by each core includes the wiring data surrounding the core, which possibly causes noise in the wiring in the core.

Figure 10:
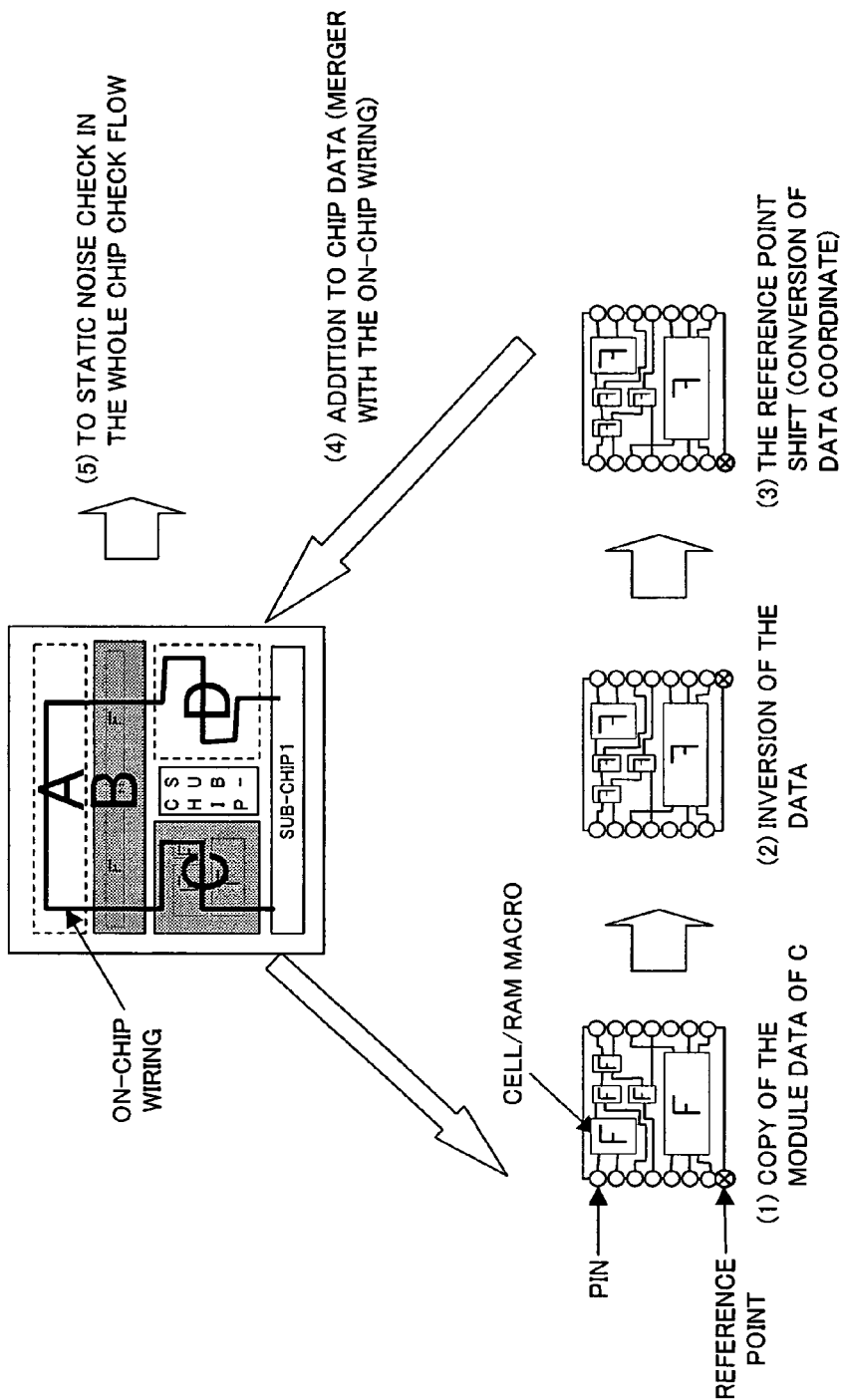
FIG. 10 is an explanatory diagram of the generation of check data of the whole chip.

FIG. 10 is an explanatory diagram of the generation of static noise check data of the whole chip. The data of the core A and the core C made in the processes from the step (1) to the step (3) explained in FIG. 8, the data of the core B and the core D and chip wiring data, are all merged. In the step (4), the merged data is incorporated into the chip data, and in the step (5) it is provided as the data for static noise check in the whole chip check shown in FIG. 7.

Figure 11:
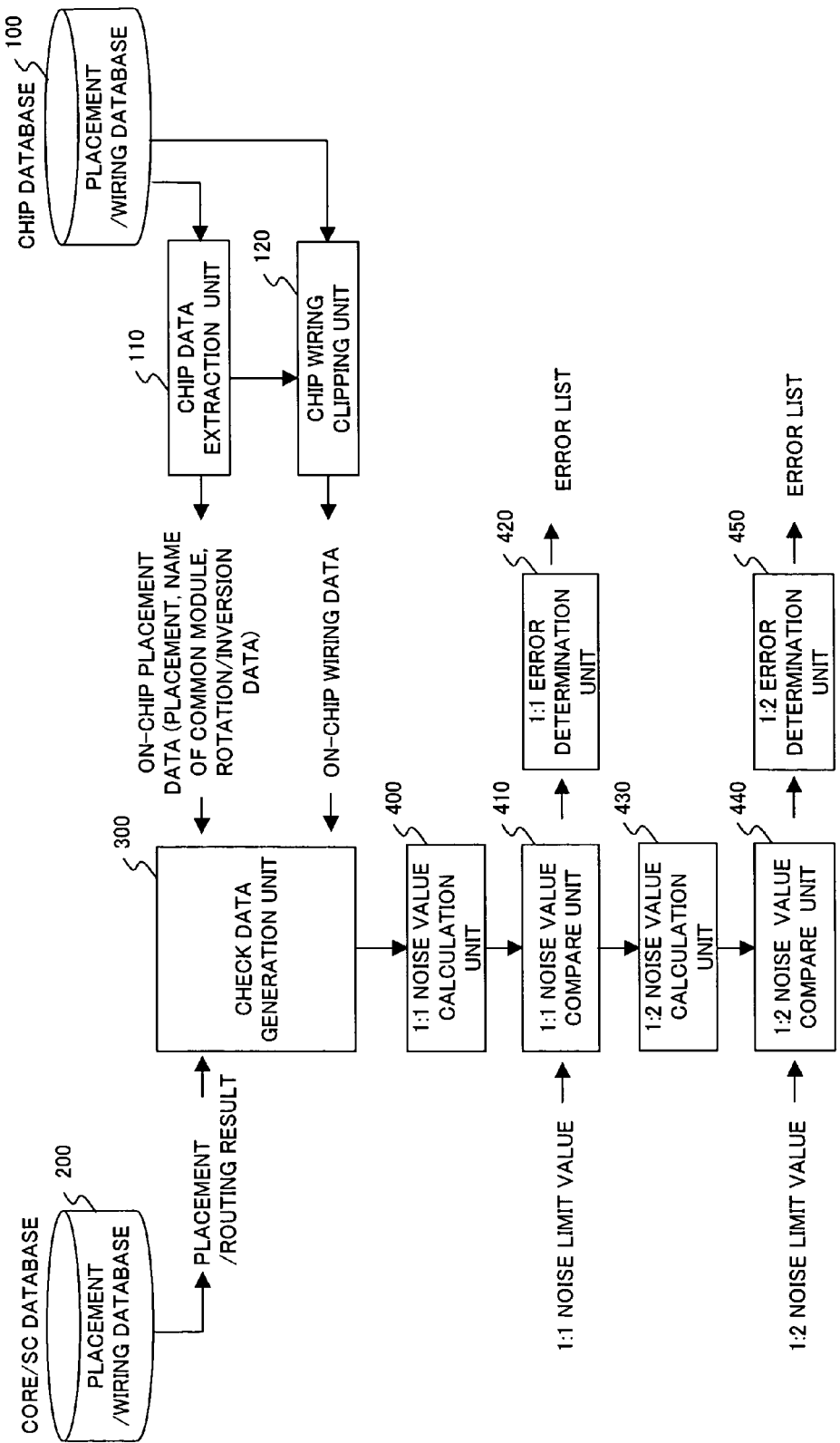
FIG. 11 is a functional block diagram (the static noise check part)

FIG. 11 is a functional block diagram describing the static noise check part in the LSI hierarchical design. A chip database 100 is a placement/wiring database in the chip-level, and a core/sub-chip database 200 is a placement/wiring database in the sub-chip level. A check data generation unit 300 makes static noise check data based on the on-chip placement data (placement, name of the common module, rotation/inversion data) made from the sub-chip level placement/wiring data in the chip data extraction unit 110, on-chip wiring data clipped by the chip wiring clipping unit 120 and placement/routing result in the core and sub-chip stored in the core/sub-chip database.

Figure 1:
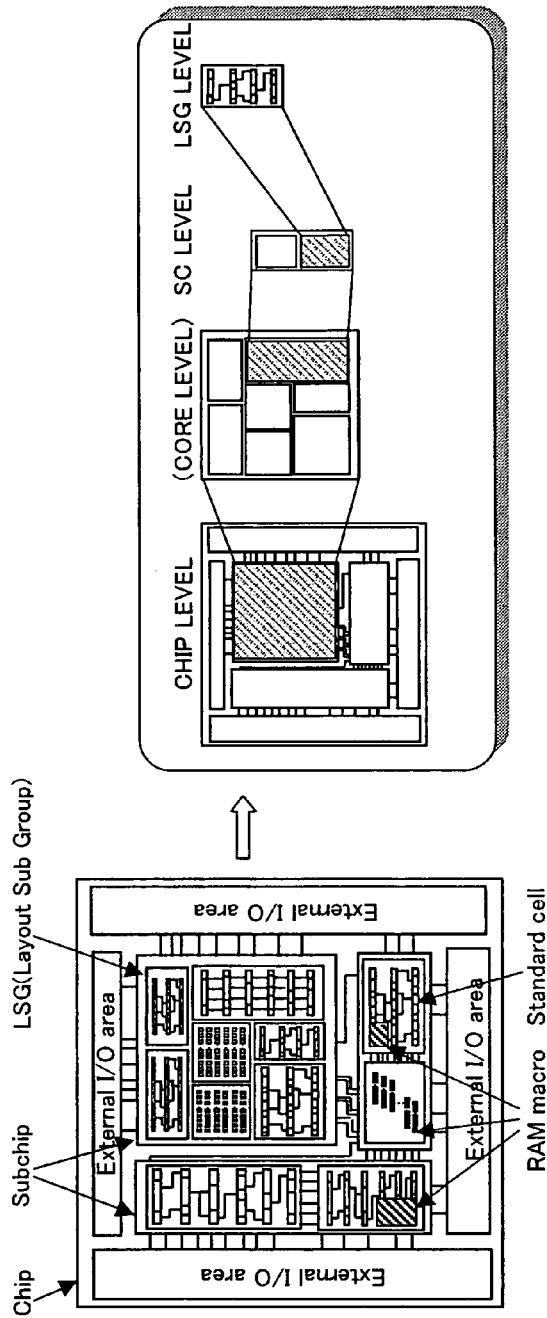
FIG. 1 explains the hierarchical configuration (4-tier) of the LSI design.
Figure 2:
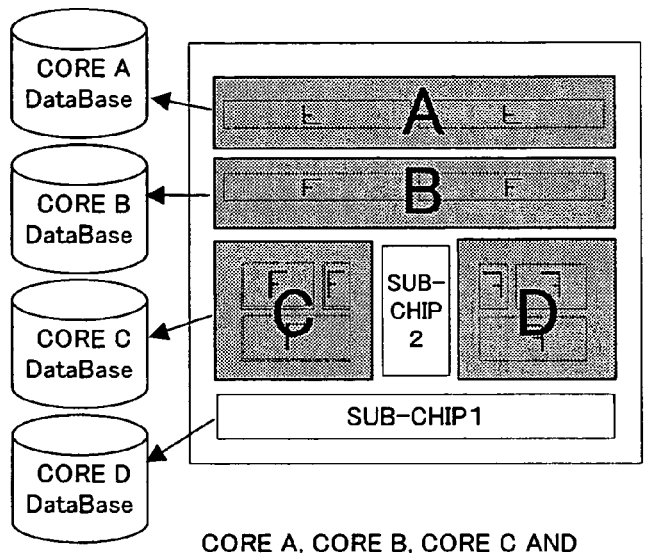
FIG. 2 shows a conventional design method.
Figure 4:
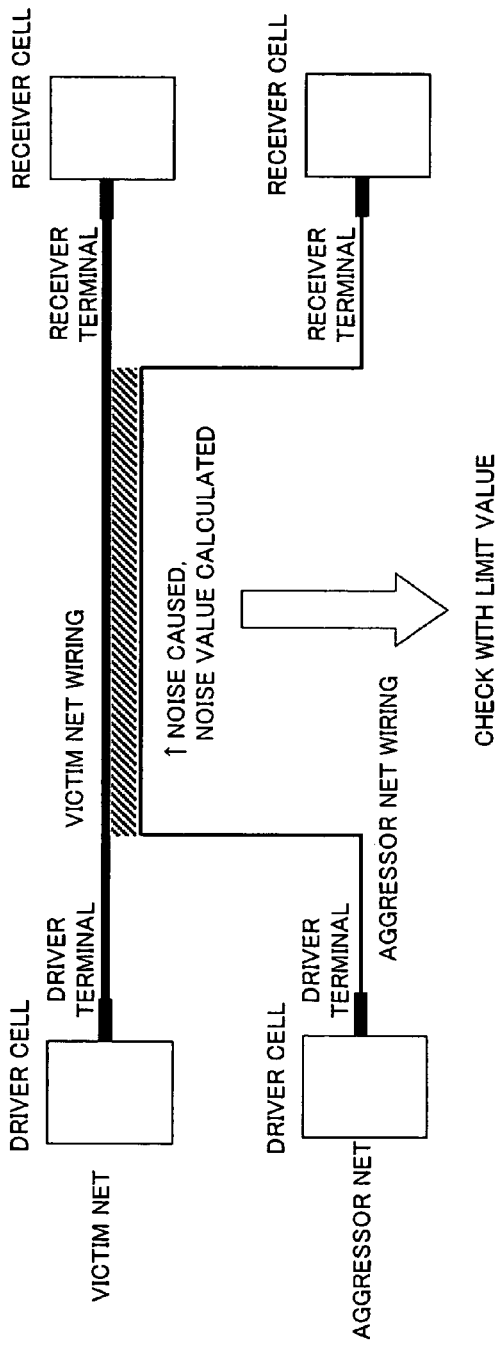
FIG. 4 is a model of net path, which performs static noise check.
Figure 5:
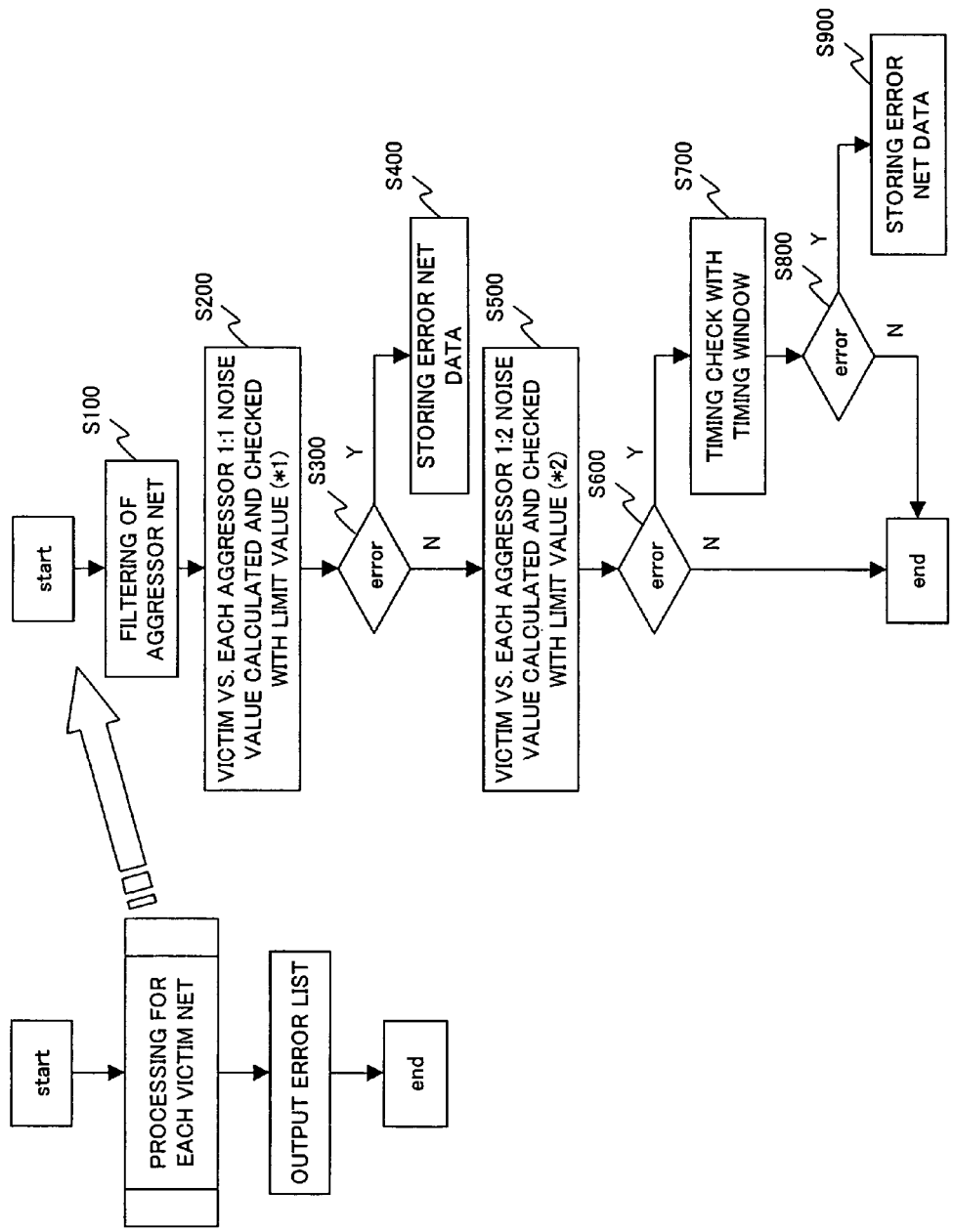
FIG. 5 explains the flow of static noise check.

A 1:1 noise value calculation unit 400 calculates the 1:1 noise value by the approach explained in FIG. 5, for example, based on the data made in the check data generation unit 300. The 1:1 noise value compare unit 410 determines whether the calculated noise value is smaller or larger than the 1:1 noise limit value, and the 1:1 error determination unit 420 determines the error and outputs the error list.

A 1:2-noise value calculation unit 430, later, calculates the 1:2 noise value by the approach explained in FIG. 5, for example, based on the data made in the check data generation unit 300.

A 1:2 noise value compare unit 440 determines whether the calculated noise value is smaller or larger than the 1:2 noise limit value, and a 1:2 error determination unit 450 determines the error and outputs the error list.

Figure 12:
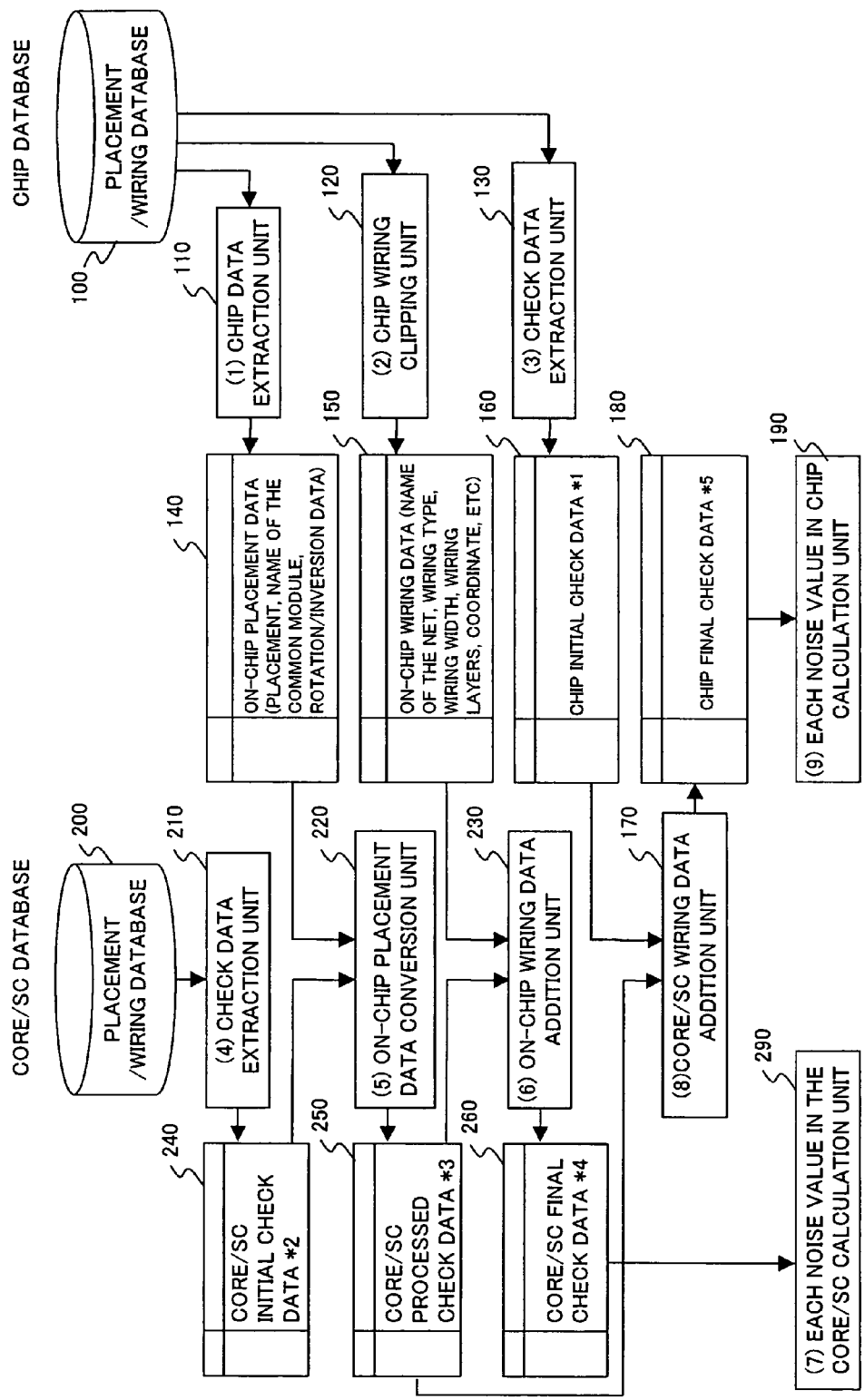
FIG. 12 is a data table diagram (the static noise check part)

FIG. 12 explains the data table, used in the static noise check part, along with the processing for producing the table in a memory means and the processing for referring to the produced table. It is obvious that the above processing can be realized by the program manipulation of a computer.

An on-chip placement data table 140 is produced in the memory means from the chip database 100 by the chip data extraction unit 110 in the step (1). Placement, the name of the common module and rotation/invention data are stored in the on-chip placement data table140.

An on-chip wiring data table 150 is produced in the memory means from the chip database 100 by the chip wiring clipping unit 120 in the step (2). The net name, wiring types, wiring width, wiring layers and coordinates are stored in the on-chip wiring data table 150. The chip initial check data table 160 is produced in the memory means from the chip database 100 by the check data extraction unit 130 in the step (3).

In the step (4), meanwhile, a core/sub-chip initial check data table 240 is produced from the core/sub-chip database 200 by a check data extraction unit 210.

In the step (5), a core/sub-chip processed check data table 250 is produced from the core/sub-chip initial check data table 240 and the on-chip placement data table 140 by the on-chip placement data conversion unit 220. The data of the core/sub-chip, which has the initial check data in the core/sub-chip database 200, is shifted without the data conversion. However, as to the data of the core, which does not have the core-level design data, the core/sub-chip processed check data is produced from the core comprising the common design data. The core/sub-chip final check data table 260 is produced from the core/sub-chip processed check data table 250 and the on-chip wiring data table 150 by the on-chip wiring data addition unit 230 in the step (6). The produced core/sub-chip final check data is provided to each noise value calculation unit290 of the cores and sub-chips in the step (7).

In the step (8), the chip final check data table 180 is produced from the core/sub-chip processed check data table 250 and the chip initial check data table 160 by the core/sub-chip wiring data addition unit 170. The produced chip final check data is provided to each noise value calculation unit190 in chips in the step (9).

Figure 13:
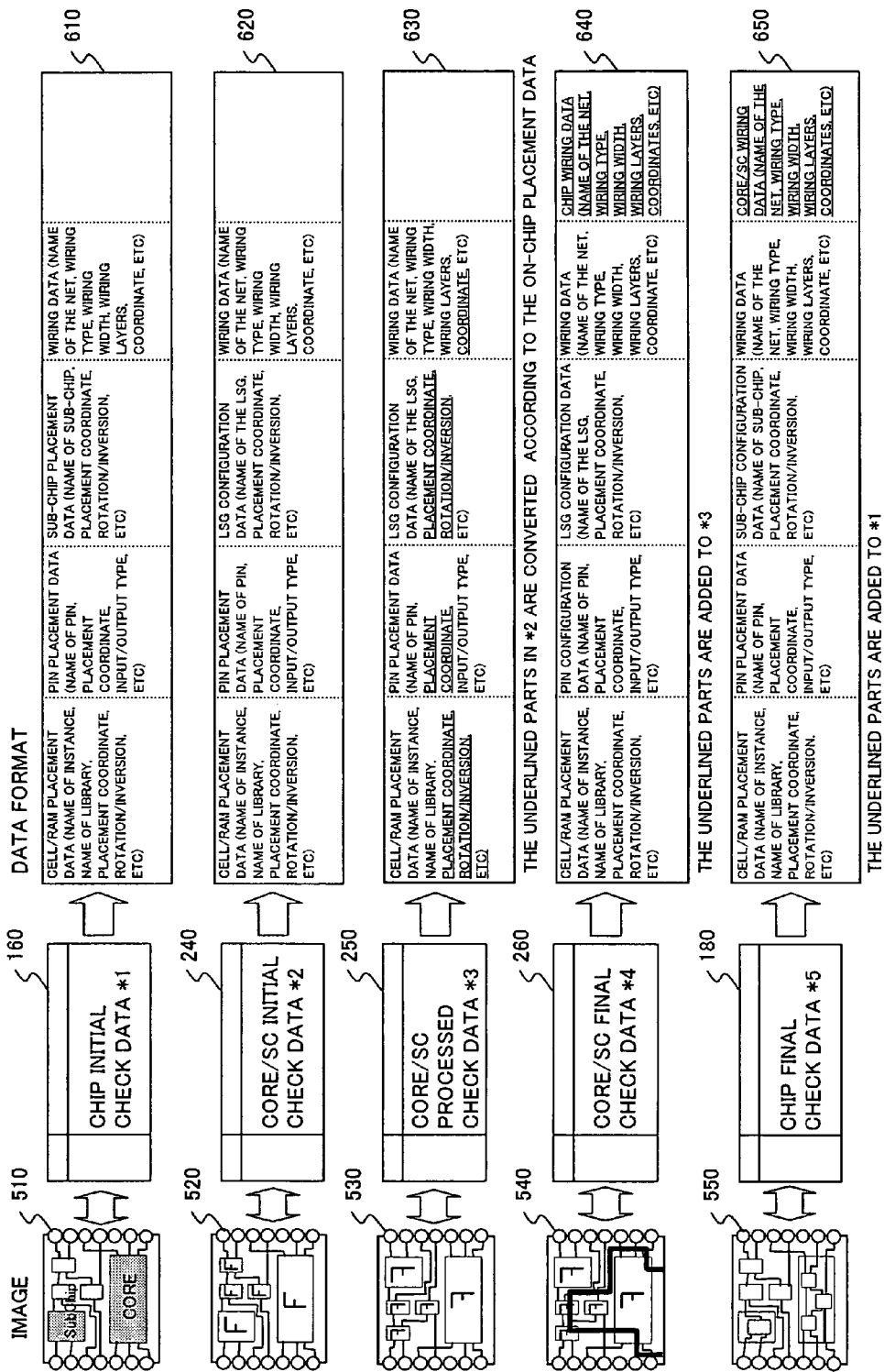
FIG. 13 is explanatory diagrams of an image and data format of each data table.

FIG. 13 is explanatory diagrams of an image and data format of each data table.

As shown in the data format 610, the chip initial check data table 160 consists of cell/RAM placement data, comprising an instance name, a library name, a placement coordinate, and rotation/inversion etc.; pin placement data, including pin name, placement coordinate and input/output type etc.; the core/sub-chip placement data, comprising core/sub-chip name, placement coordinate and rotation/inversion etc.; and wiring data, comprising net name, wiring type, wiring width, wiring layers, and coordinate etc.

The data format 620 of the core/sub-chip initial check data table 240 consists of cell/RAM placement data, pin placement data, wiring data, and LSG data comprising LSG name, placement coordinate and rotation/inversion etc.

The data format 630 of the core/sub-chip processed check data table 250 is the same as the data format 620, and the underlined parts in FIG. 13, such as placement coordinate and rotation/inversion of cell/RAM placement data and LSG placement data are converted by the on-chip placement data conversion unit 220 following the on-chip placement data table140. From the image 520 of the core/sub-chip initial check data table 240 and the image 530 of the core/sub-chip processed check data table 250, it is perceivable that the core/sub-chip processed check data is produced by inverting the common module.

The data format 640 of the core/sub-chip final check data table 260 is made from the data format 630 of the core/sub-chip processed check data table250 by adding the chip wiring data such as net name, wiring type, wiring width, wiring layers, and coordinate. This is shown in each of the images 530 and 540.

The format 650 of the chip final check data table 180 is made from the data format 610 of the chip initial check data table 160 by adding the core/sub-chip wiring data of the core/sub-chip processed check data table 250. This is conceivable from the image 550 when the image 510 of the chip check data table 160 is compared with the image 550 of the chip final check data table 180.

As explained above, according to the present invention, for the cores having the same module, the design data is obtained from the design of the single base core, and the whole chip static noise check data is generated based on the design data and the chip data of each core, and so the load of the design operation can be reduced.

What is claimed is:

1. A generation method of static noise check data for a hierarchical layout design of a semiconductor device having a plurality of cores each including same sub-chips, wherein the semiconductor device comprising a sub-chip level hierarchy, a core level hierarchy, and a chip level hierarchy as a layout hierarchy of the layout design and the generation method comprising:
    inputting a design data of the core level hierarchy of one of the plurality of cores of the semiconductor device;
    generating a static noise check data of the core level hierarchy of one of the plurality of cores;
    copying the inputted design data of the core level hierarchy of one of the plurality of cores;
    performing inversion or rotation processing of the copied design data of the core level hierarchy;
    converting coordinates of the inverted or the rotated design data of the core level hierarchy to the design data of the chip level hierarchy, and generating a design data of the chip level hierarchy;
    adding a chip wiring data of the chip level hierarchy on the design data of the chip level hierarchy, and generating a merged design data of the chip level hierarchy; and
    generating the static noise check data of the chip level hierarchy.

* * * * *